US008088552B2

(12) United States Patent
Ozaki et al.

(10) Patent No.: US 8,088,552 B2

(45) Date of Patent: Jan. 3, 2012

(54) PHOTOSENSITIVE COMPOSITION AND LITHOGRAPHIC PRINTING ORIGINAL PLATE USING THE COMPOSITION

(75) Inventors: Jun Ozaki, Warabi (JP); Masaro Nakatsuka, Warabi (JP); Keiko Yonezawa, Warabi (JP); Naoya Sato, Warabi (JP)

(73) Assignee: Okamoto Chemical Industry Co., Ltd., Warabi-shi, Saitama-ken (JP)

( * ) Notice: Subject to any disclaimer, the term of this patent is extended or adjusted under 35 U.S.C. 154(b) by 477 days.

(21) Appl. No.: 12/289,777

(22) Filed: Nov. 4, 2008

(65) Prior Publication Data

US 2009/0208870 A1 Aug. 20, 2009

(30) Foreign Application Priority Data

Feb. 15, 2008 (JP) ................................. 2008-033940

(51) Int. Cl.

*G03F 7/004* (2006.01)
*G03F 7/027* (2006.01)
*G03F 7/028* (2006.01)

(52) U.S. Cl. ................ 430/270.1; 430/281.1; 430/287.1

(58) Field of Classification Search ............... 430/270.1, 430/281.1, 287.1, 288.1, 944, 271.1, 273.1
See application file for complete search history.

(56) References Cited

U.S. PATENT DOCUMENTS

| | | | | |
|---|---|---|---|---|
| 7,122,293 | B2 * | 10/2006 | Sugasaki et al. | 430/273.1 |
| 2007/0202434 | A1 * | 8/2007 | Arias et al. | 430/270.1 |
| 2009/0186299 | A1 * | 7/2009 | Tao et al. | 430/281.1 |

FOREIGN PATENT DOCUMENTS

| | | | |
|---|---|---|---|
| JP | 4-161957 | A | 6/1992 |
| JP | 2004-109851 | A | 4/2004 |
| JP | 2007-272079 | A | 10/2007 |
| JP | 2007-272134 | A | 10/2007 |

* cited by examiner

*Primary Examiner* — Anca Eoff

(74) *Attorney, Agent, or Firm* — Foley & Lardner LLP

(57) ABSTRACT

A thermal negative type lithographic printing original plate has a photosensitive layer featuring high sensitivity, excellent reproducibility in FM screening, and excellent print durability and chemical resistance at a minute image portion. A photosensitive composition for the photosensitive layer contains an alkali soluble resin having a monomer unit represented by the formula (I), a silane coupling agent represented by the formula (II), an infrared absorber, a radical polymerization initiator, and a polymerizable compound having an ethylenic double bond and an amount of the silane coupling agent is from 15 to 40% of the photosensitive composition by mass.

3 Claims, No Drawings

PHOTOSENSITIVE COMPOSITION AND LITHOGRAPHIC PRINTING ORIGINAL PLATE USING THE COMPOSITION

The present application is based on and claims priority of Japanese Patent Application No. 2008-033940 filed on Feb. 15, 2008, the entire contents of which are hereby incorporated by reference.

BACKGROUND OF THE INVENTION

1. Field of the Invention

The present invention relates to a lithographic printing original plate. The present invention also relates to a negative type lithographic printing original plate used for direct plate making based on digital signals from computers or the like.

2. Background Art

As lithographic printing original plates, those having a lipophilic photosensitive resin layer disposed on a hydrophilic support have heretofore been used widely. A plate making method commonly employed is a method of forming a desired printing plate by carrying out mask exposure via a lith film and then dissolving and removing a non-image portion.

A digitalization technique which electronically treats, accumulates, and outputs image data by using a computer has spread widely. A variety of new image output systems suited for such digitalization techniques have therefore been put into practical use. As a result, there is a strong demand for the development of computer-to-plate (CTP) techniques in which light with high directivity, such as laser light, is scanned in accordance with digitalized image data, and a printing plate is made directly without using a lith film. It is therefore an important technical problem to obtain a lithographic printing original plate capable of satisfying such a tide.

As such a lithographic printing original plate which can be subjected to scanning exposure, that has, on a hydrophilic support, a photosensitive layer containing a photosensitive composition capable of generating an active species such as radicals by exposure to a laser, has already been proposed and is on the market. A negative type lithographic printing plate can be obtained by subjecting such a lithographic printing original plate to laser scanning exposure based on digital data to generate a chemical species, causing a physical or chemical change of the photosensitive layer to insolubilize it by making use of the action of the chemical species, and then carrying out development.

With recent innovation in CTP technology, usage frequency of highly precise FM screening has increased, and better print quality is desired. When FM screening, in which an assembly of minute images, is used for image formation is employed, however, it is very difficult to achieve improvement in print durability and chemical resistance of the minute images. For example, a method described in Japanese Application Publication No. 04-161957 is conventionally known as a method of improving print durability. Japanese Application Publication No. 04-161957 describes that the addition of a trace amount of a silane coupling agent having an unsaturated double bond to a photopolymerizable composition which is reactive with ultraviolet or visible light improves adhesion between an aluminum substrate and a photosensitive layer disposed thereover, thereby improving print durability. In such a photosensitive layer, improvement in print durability is observed in a very large image portion corresponding to from 65 to 110 lines, but improvement in print durability and chemical resistance of minute images used in FM screening has not yet been confirmed. In recent years, a method of improving print durability of a thermal negative type photosensitive composition which is reactive with light in the infrared region is disclosed in Japanese Application Publication No. 2004-109851, Japanese Application Publication No. 2007-272079, and Japanese Application Publication No. 2007-272134. These patent documents describe that a high-density and strong crosslink structure is formed promptly by using a specific alkali soluble polymer and therefore high density and excellent print durability can be achieved. Also in these patent documents, however, print durability and chemical resistance of minute images have not yet been confirmed. In particular, thermal negative type lithographic printing plates omitting a polymerization acceleration step called "preheating" is different from a printing plate using a photopolymerizable composition which is reactive with light in the ultraviolet and visible light regions so that curing of the image is insufficient at a low exposure amount, and print durability of a minute image becomes insufficient. As a result, the plate is likely to have degraded chemical resistance. For high-quality printing making use of FM screening, improvement in print durability and chemical resistance of a minute image portion become indispensable conditions, and there is therefore room for early improvement.

SUMMARY OF THE INVENTION

Accordingly, an object of the invention is to provide a thermal negative type lithographic printing original plate having a photosensitive layer featuring high sensitivity, excellent reproducibility in FM screening, and excellent print durability and chemical resistance in a minute image portion; and a photosensitive composition for the photosensitive layer.

In order to achieve the above-described object, the photosensitive composition relating to the invention is characterized in that it contains an alkali soluble resin having a monomer unit represented by the following formula (I):

(I)

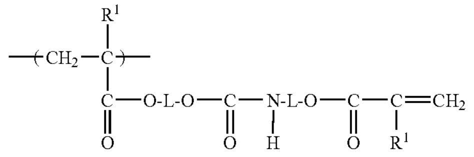

wherein, $R^1$ represents a hydrogen atom or a $C_{1-10}$ alkyl group which may have a substituent, and L represents an alkylene group which may have a substituent or an arylene group which may have a substituent; a silane coupling agent represented by the following formula (II):

(II)

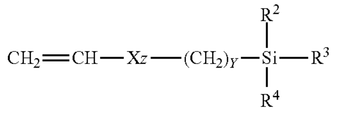

wherein, $R^2$ to $R^4$ each represents a hydrogen atom, an alkyl group which may have a substituent, or an alkoxy group, X represents an ester bond, an amide bond, or a phenylene group, Z stands for 0 or 1, and Y stands for an integer from 1 to 10; an infrared absorber, a radical polymerization initiator; and a polymerizable compound having an ethylenic double bond and it contains the silane coupling agent in an amount ranging from 15 mass % to 40 mass % of the photosensitive composition.

The alkali soluble resin preferably contains a monomer unit represented by the following structural formula (III) and/or (IV):

(III)

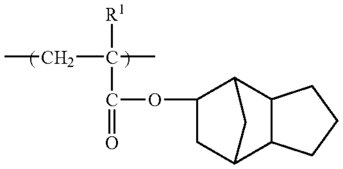

(IV)

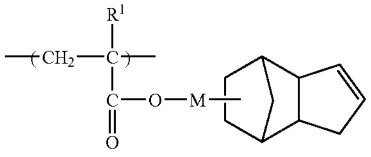

wherein, in the formulas (III) and (IV), $R^1$ represents a hydrogen atom or a $C_{1-10}$ alkyl group which may have a substituent, and M represents a $C_{1-10}$ alkylene group which may have a substituent.

A negative type lithographic printing original plate relating to the invention is characterized in that it has, on a support thereof, a photosensitive layer containing the above-described photosensitive composition. The photosensitive layer can have thereon a protective layer.

As described in detail below, in the negative type lithographic printing original plate equipped with a photosensitive layer containing a photosensitive composition having a specified alkali soluble resin and a specified silane coupling agent in an amount of 15 mass % or greater and not greater than 40 mass % based on the total mass of the photosensitive composition, a very high-density crosslink structure is formed by high-speed polymerization of an unsaturated double bond site in the silane coupling agent and a specific unsaturated double bond site in the alkali soluble resin when the plate is exposed to an infrared laser beam. At the time of formation of a photosensitive film by application, the silyl site in the silane coupling agent undergoes self condensation and a complex structural change. The mutual action between these inorganic compounds in the photosensitive film is presumed to form a stronger photosensitive film. It is therefore possible to obtain a high-quality printing plate that is superior in print durability and chemical resistance of minute image portions by using a photosensitive layer having the photosensitive composition of the invention containing a specified alkali soluble resin and a specified silane coupling agent in an amount of 15 mass % or greater and not greater than 40 mass % based on the total mass of the photosensitive composition. Moreover, incorporation of a monomer unit having the structural formula (III) and/or (IV) drastically raises a glass transition temperature (Tg) of the entire alkali soluble resin, making it possible to form a strong image.

DETAILED DESCRIPTION OF PREFERRED EMBODIMENT

In the photosensitive composition of the invention, the polymerizable compound having a monomer unit of the formula (I) is provided, for example, by the addition reaction of a polymerizable compound having an alcoholic hydroxyl group and an isocyanate compound having an unsaturated double bond. In the formula (I), L represents an alkylene group which may have a substituent or an arylene group which may have a substituent.

The content of the polymerizable compound having the structural formula (I) is from 5 to 70 mass %, preferably from 10 to 60 mass % in the alkali soluble resin. When the content is 5 mass % or greater, especially 10 mass % or greater, a strong image with high flexibility can be obtained by image formation. A content not greater than 70 mass %, especially not greater than 60 mass %, on the other hand, facilitates dissolution in an aqueous alkali solution, increases development speed, and does not reduce the sensitivity. Contents within the above-described range are therefore preferred.

In the photosensitive composition of the invention, use of the monomer unit represented by the formula (III) and/or (IV) for the alkali soluble resin is preferred. The compound represented by the formula (III) and/or (IV) can be obtained, for example, by reaction between an alcohol compound having a specific alicyclic structure and an acrylate ester having an unsaturated double bond. The compounds of the formula (III) and the formula (IV) are commercially available, for example, from Hitachi Chemical. In the formulas (III) and (IV), $R^1$ represents a hydrogen atom or a $C_{1-10}$ alkyl group which may have a substituent. When $R^1$ represents an alkyl group, the number of carbon atoms of the alkyl group is preferably from 1 to 3. In $R^1$, the alkyl group may be any of a linear, branched or cyclic group. Examples of the substituent which the alkyl group may have include halogen atoms, especially, chlorine and bromine atoms, hydroxyl group, nitro group, carboxyl group, amino group, cyano group, and sulfuric acid group. L represents a $C_{1-10}$ alkylene group which may have a substituent.

The content of the polymerizable compound having a structural formula of (III) and/or (IV) in the alkali soluble resin is preferably from 5 to 40 mass %, more preferably from 10 to 30 mass %. When the content is 5 mass % or greater, especially 10 mass % or greater, the resulting composition is stable in an aqueous alkali solution to be used as a developer and an image formed using the composition is highly resistant to chemicals. A content not greater than 40 mass %, especially not greater than 30 mass %, on the other hand, facilitates dissolution in an aqueous alkali solution, increases a development speed, and does not reduce the sensitivity. The contents within the above-described range are therefore preferred.

As another monomer having a polymerizable unsaturated bond group and to be added as needed to the above-described components, monomers described in the following (1) to (10) are desired.

(1) Monomers having a phenolic hydroxyl group, for example, N-(4-hydroxyphenyl)acrylamide, N-(4-hydroxyphenyl)methacrylamide, p-isopropenylphenol, o-hydroxyphenyl acrylate, m-hydroxyphenyl acrylate, p-hydroxyphenyl acrylate, o-hydroxyphenyl methacrylate, m-hydroxyphenyl methacrylate, and p-hydroxyphenyl methacrylate.

(2) Monomers having a sulfonamide group, for example, m-aminosulfonylphenyl methacrylate, N-(p-aminosulfonylphenyl)methacrylamide, and N-(p-aminosulfonylphenyl)acrylamide.

(3) Monomers having an active imide group, for example, N-(p-toluenesulfonyl)methacrylamide and N-(p-toluenesulfonyl)acrylamide.

(4) Monomers having an aliphatic hydroxyl group, for example, 2-hydroxyethyl acrylate, 2-hydroxyethyl methacrylate, 2-hydroxy-3-phenoxypropyl acrylate, and 2-hydroxy-3-phenoxypropyl methacrylate.

(5) α,β-unsaturated carboxylic acids, for example, acrylic acid, methacrylic acid, and maleic anhydride.

(6) Monomers having an allyl group, for example, allyl methacrylate and N-alkylmethacrylamide.

(7) Alkyl acrylates and alkyl methacrylates, for example, methyl acrylate, ethyl acrylate, propyl acrylate, butyl acrylate, amyl acrylate, hexyl acrylate, octyl acrylate, lauryl acrylate, glycidyl acrylate, methyl methacrylate, ethyl methacrylate, propyl methacrylate, butyl methacrylate, amyl methacrylate, hexyl methacrylate, octyl methacrylate, lauryl methacrylate, and glycidyl methacrylate.

(8) Acrylamides and methacrylamides, for example, acrylamide, N-methylolacrylamide, N-ethylacrylamide, N-hexylacrylamide, N-cyclohexylacrylamide, N-hydroxymethylacrylamide, N-phenylacrylamide, methacrylamide, N-methylolmethacrylamide, N-ethylmethacrylamide, N-hexylmethacrylamide, N-cyclohexylmethacrylamide, N-hydroxyethylmethacrylamide, and N-phenylmethacrylamide.

(9) Styrenes, for example, styrene, α-methylstyrene, and chloromethylstyrene.

(10) N-vinylpyrrolidone, N-vinylcarbazole, 4-vinylpyridine, acrylonitrile, methacrylonitrile and the like.

These monomers may be used only or the compounds belonging to the same group of (1) to (10) or compounds belonging to different groups may be used in combination.

The content of the another monomer to be incorporated as needed in the copolymer is from 1 to 40 mass %, preferably from 5 to 40 mass %, in the alkali soluble resin.

No particular limitation is imposed on the preparation process of the copolymer, and an ordinary process for preparing a vinyl or acrylic copolymer can be employed. For example, a desired copolymer can be obtained by dissolving monomer components in a suitable solvent, adding a conventionally used radical polymerization initiator to the resulting solution, and carrying out polymerization by heating, if necessary. The copolymer thus obtained is usable when it has a polystyrene-equivalent weight average molecular weight ranging from 10,000 to 200,000, preferably from 20,000 to 100,000, as measured by gel permeation chromatography (GPC). When the weight average molecular weight is less than 10,000, the image portion is likely to swell, which leads to insufficient mechanical strength. When it exceeds 200,000, staining due to poor development is likely to occur. Weight average molecular weights outside the above-described range are therefore not preferred.

Examples of the solvent to be used for preparing the copolymer by polymerization include methyl cellosolve, propylene glycol monomethyl ether, dioxane, methyl ethyl ketone, cyclohexanone, N,N-dimethylformamide, and N,N-dimethylacetamide. Examples of the radical polymerization initiator to be used for preparing the copolymer by polymerization include 2,2'-azobis(2-methylbutyronitrile) and benzoyl peroxide. It is added in an amount of from 0.1 to 1.0 mass % based on the total mass of the monomers.

The copolymers to be used in the invention may be used either alone or in combination. Of these, for example, a copolymer of an acrylic acid derivative is preferred. As the copolymer of an acrylic acid derivative, an alkali soluble copolymer which is an acrylic acid copolymer having a side-chain carboxyl group and having, at an end thereof, a polymerizable double bond obtained by addition reaction of glycidyl methacrylate to the carboxyl group is especially preferred.

An introduction percentage of glycidyl methacrylate is from 20 to 70%, more preferably from 30 to 60%, relative to the carboxyl group in the copolymer. The introduction percentages less than 20% may considerably deteriorate the sensitivity, whereas the introduction percentages exceeding 70% may deteriorate the development property.

The Mw of the copolymer of an acrylic acid derivative is preferably from 1,000 to 500,000, especially preferably from 1,500 to 300,000. When the Mw is 1,000 or greater, especially 1,500 or greater, a particularly satisfactory film can be obtained. The Mws not greater than 500,000, especially not greater than 300,000, improve the solubility of the exposed portion in an alkali developer and enable particularly good development.

Although not particularly limited, a polyurethane resin is preferably contained in the photosensitive composition of the invention. It has a glass transition temperature (Tg) of from 50 to 180° C., and more preferably from 70 to 150° C. A glass transition temperature (Tg) of less than 50° C. may deteriorate the film forming property, in other words, it may make it difficult to form a uniform surface of a photosensitive layer and easily cause surface stickiness. Those exceeding 180° C. may deteriorate alkali solubility and easily cause poor development. Glass transition temperatures (Tg) outside the above-described range are therefore not preferred. The glass transition temperature (Tg) as used herein was measured using "DSC-60" (trade name of a differential scanning calorimeter, product of Shimadzu). The average molecular weight (Mw) of the polyurethane resin is not particularly limited and any polyurethane resin used conventionally can be employed.

Usually, the alkali soluble polyurethane resin is a polyurethane resin having a side-chain carboxyl group, which is described in Japanese Application Publication No. 2002-311579. The polyurethane resin has, at an end thereof, a polymerizable double bond which is formed by addition reaction of glycidyl methacrylate to the carboxyl group of the polyurethane resin.

In synthesizing an alkali-soluble polyurethane resin having a polymerizable double bond at an end thereof, which is preferably incorporated in the photosensitive composition of the invention, the following diisocyanate compounds are preferably used. Examples thereof include 2,4-tolylene diisocyanate, 2,6-tolylene diisocyanate, p-xylene diisocyanate, m-xylene diisocyanate, 4,4-diphenylmethane diisocyanate, 1,5-naphthalene diisocyanate, 3,3-dimethylbiphenyl-4,4-diisocyanate, hexamethylene diisocyanate, trimethylhexamethylene diisocyanate, lysine diisocyanate, isophorone diisocyanate, 4,4-methylenebis(cyclohexyl isocyanate), methylcyclohexyl-2,4(or 2,6)-diisocyanate, and 1,3-bis(isocyanatomethyl)cyclohexane.

In the photosensitive composition of the invention, carboxyl-containing diol compounds for preparing the alkali soluble polyurethane resin include the following compounds. Examples of the carboxyl-containing diol compound include 3,5-dihydroxybenzoic acid, 2,2-bis(hydroxymethyl)propionic acid, 2,2-bis(hydroxypropyl)propionic acid, N,N-2,2-dihydroxyethylglycine, bis(hydroxymethyl)acetic acid, 4,4-bis(4-hydroxyphenyl)pentanoic acid, and tartaric acid.

The content of the carboxyl-containing diol compound in the alkali soluble polyurethane resin is from 20 to 50 mol %, and more preferably from 25 to 45 mol %. A content of less than 20 mol % may deteriorate the development property and narrow the addition ratio of glycidyl methacrylate. A content exceeding 50 mol %, on the other hand, deteriorates the image intensity at the time of development, and at the same time, makes it impossible to incorporate another diol component.

Diol compounds which do not have a carboxyl group and may have another substituent unreactive with the isocyanate can also be used. Specific examples of such a diol compound include ethylene glycol, diethylene glycol, triethylene glycol, tetraethylene glycol, propylene glycol, dipropylene glycol, polyethylene glycol, polypropylene glycol, polyester polyol, polycarbonate diol, neopentyl glycol, 1,3-butylene glycol, 1,6-hexanediol, 2,2,4-trimethyl-1,3-pentanediol, 1,4-bis-β-hydroxyethoxycyclohexane, cyclohexanedimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxyethyl ether, p-xylene glycol, dihydroxyethylsulfone, bis(2-hydroxyethyl)-2,4-tolylene dicarbamate, and bis (2-hydroxyethyl)isophthalate.

The alkali soluble polyurethane resin having, at an end thereof, a polymerizable double bond which is formed by addition reaction of glycidyl methacrylate to the carboxyl group of a polyurethane resin having a side-chain carboxyl group can be synthesized by a two-stage reaction. The polyurethane resin serving as a principal skeleton can be synthesized by heating the diisocyanate compound, the carboxyl-containing diol compound, and the carboxyl-free diol compound in an aprotic solvent while adding known catalysts suited for their reactivities, respectively. Then, addition reaction of glycidyl methacrylate to the resulting polyurethane resin serving as a principal skeleton is performed to synthesize the alkali soluble polyurethane resin. The molar ratio of diisocyanate compound to diol compounds is preferably from 0.8:1 to 1.2:1. When the isocyanate group remains at the end of the polymer, treatment with an alcohol or amine enables synthesis of the polyurethane resin without leaving an isocyanate group.

An introduction ratio of glycidyl methacrylate is from 20 to 70%, more preferably from 30 to 60%, relative to the carboxyl group in the polyurethane resin which will be a principal skeleton in the first stage reaction. Introduction ratios less than 20% may prevent the exhibition of print durability improving effects, whereas introduction ratios exceeding 70% may deteriorate the development property.

An embodiment of the invention will hereinafter be described. It should, however, be borne in mind that the invention is not limited by the embodiments that are described hereinafter. The silane coupling agent (II) to be used in the photosensitive composition of the invention can be synthesized, for example, by carrying out addition reaction of an aryl ether compound to trichlorosilane and then alkoxylating the reaction product. These compounds are commercially available from Shin-Etsu Chemical, Dow Corning Toray, Gelest, and Chisso. In the silane coupling agent (II), $R^2$, $R^3$ and $R^4$ may be the same or different and each represents a hydrogen atom, a $C_{1-10}$ alkyl group which may have a substituent or an alkoxy group. When any of $R^2$, $R^3$ and $R^4$ represents an alkoxy group, the number of carbon atoms thereof is preferably from 1 to 3. In the silane coupling agent (II), X represents an ester bond, an amide bond, or a phenyl group, Z stands for 0 or 1, and Y stands for an integer from 0 to 10, preferably from 0 to 5.

A content of the silane coupling agent of the formula (II) is preferably from 15 to 40 mass %, and more preferably from 20 to 40 mass % based on the total mass of the photosensitive composition. A content of 15 mass % or more may improve especially print durability and chemical resistance, whereas a content not greater than 10 mass % may deteriorate print durability and chemical resistance.

The infrared absorber to be used in the photosensitive composition of the invention is not particularly limited insofar as it is a compound capable of absorbing light of an image exposure light source and converting its energy to heat. Infrared absorbing dyes having an absorption maximum in a wavelength range of from 650 to 1,300 nm and having preferably a molar extinction coefficient ϵ of $10^5$ or greater at an absorption maximum is especially effective. The infrared absorber is used for generating heat from the infrared absorber or causing transfer of photoelectrons by exposure to light and accelerating radical generation. The photosensitive composition of the invention further containing the infrared absorber will be a negative type photosensitive layer whose solubility in an aqueous alkali solution decreases when the composition is exposed to laser light.

As the infrared absorbing dyes, cyanine dyes, squalium dyes, croconium dyes, azulenium dyes, phthalocyanine dyes, naphthalocyanine dyes, polymethine dyes, naphthoquinone dyes, thiopyrylium dyes, dithiol metal complex dyes, anthraquinone dyes, indoaniline metal complex dyes, intermolecular CT dyes and the like are preferred.

These dyes may be synthesized in a known manner. Alternatively, the following commercial available products may also be used:

"IR750" (anthraquinone dye), "IR002" and "IR003" (aluminum dyes), "IR820" (polymethine dye), "IRG022" and "IRG033" (diimmonium dyes), "CY-2", "CY-4", "CY-9", "CY-10", and CY-20" (each, trade name; product of Nippon Kayaku); "Fastogen blue 8120" (trade name, product of Dainippon Ink and Chemicals); and "MIR-101", "MIR-1011", and "MIR-1021" (each, trade name, product of Midori Kagaku).

The above-described dyes are also commercially available from other suppliers including Nippon Kanko Shikiso Kenkyujo, Sumitomo Chemical, Showa Denko, and Fuji Photo Film.

Of the above-described infrared absorbing dyes, an infrared absorber represented by the following formula (V) is especially preferred.

(V)

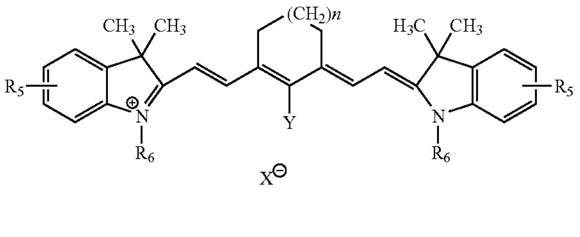

wherein, $R_5$ represents a hydrogen atom, or an alkyl or alkoxy group which may have a substituent, $R_6$ represents an alkyl group which may have a substituent or an alkoxy group, X represents a charge neutralizing ion, and n stands for from 1 to 7.

Specific examples of the infrared absorber represented by the formula (V) will next be shown, but the range of the compound is not limited thereto.

Infrared absorber (1)

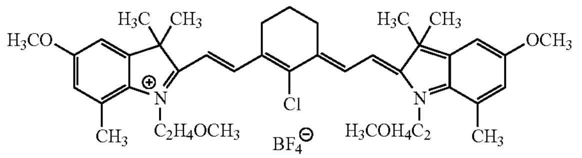

Infrared absorber (2)

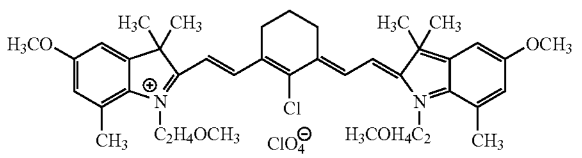

Infrared absorber (3)

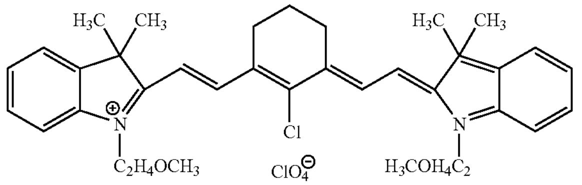

Infrared absorber (4)

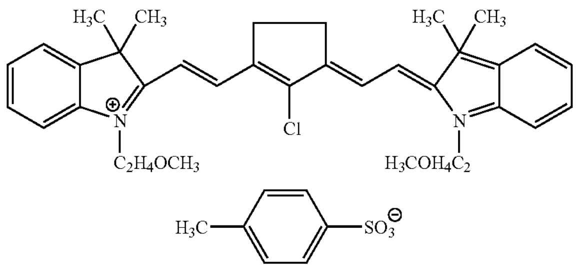

The infrared absorber is added in an amount of from 0.5 to 10 mass %, preferably from 0.6 to 8.0 mass % based on the total mass of the photosensitive composition. Amounts of 0.5 mass % or greater, especially 0.6 mass % or greater increase the sensitivity considerably while amounts not greater than 10 mass %, especially not greater than 8.0 mass % contribute to improvement in the development property of a non-image portion (unexposed portion). Amounts within the above-described range are therefore preferred.

As the radical polymerization initiator to be used in the invention, known compounds are usable. Examples include organic boron salts, trihaloalkyl-substituted compounds, hexaarylbisimidazoles, titanocene compounds, ketoxime compounds, thio compounds, organic peroxides, and onium salts (iodonium salts, diazonium salts, and sulfonium salts described in Japanese Application Publication No. 2003-114532). Of these radical polymerization initiators, organic boron salts and trihaloalkyl-substituted compounds are especially preferred. Use of an organic boron salt and a trihaloalkyl-substituted compound in combination is more preferred.

The organic boron anion constituting the organic boron salt is represented by the following formula (VI):

(VI)

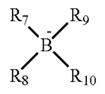

(wherein, $R_7$, $R_8$, $R_9$, and $R_{10}$ may be the same or different and each represents an alkyl group, an aryl group, an aralkyl group, an alkenyl group, an alkinyl group, a cycloalkyl group, or a heterocyclic group. It is especially preferred that one of $R_7$, $R_8$, $R_9$, and $R_{10}$ represent an alkyl group and the others be each an aryl group).

The cation constituting the organic boron salt is, for example, an alkali metal ion and an onium compound, preferably an onium salt. Examples of the onium salt include ammonium salts such as tetraalkylammonium salt, sulfonium salts such as triarylsulfonium salt, and triarylalkylphosphonium salts. The following are particularly preferred examples of the organic boron salt.

B-1

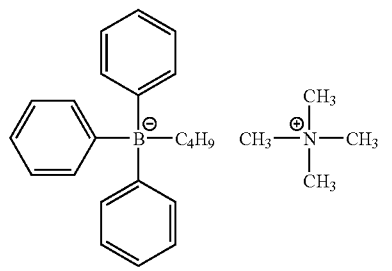

B-2

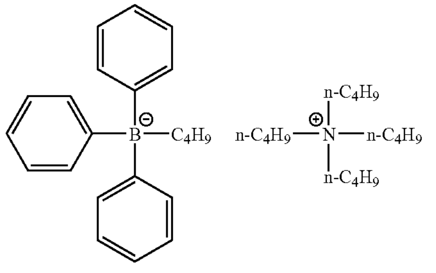

B-3

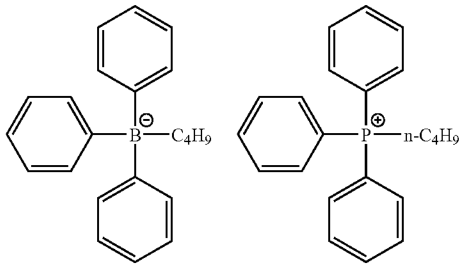

B-4

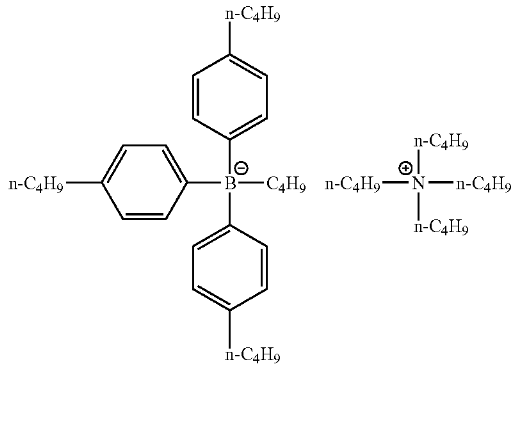

-continued

B-5

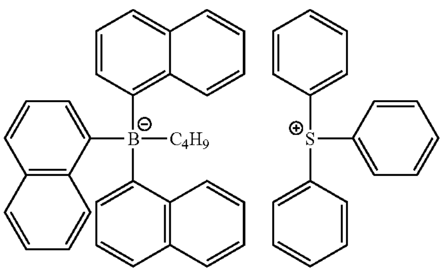

B-6

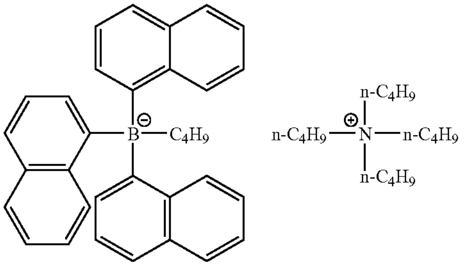

Another preferred radical polymerization initiator is a trihaloalkyl-substituted compound. The trihaloalkyl-substituted compound is a compound having, in the molecule thereof, at least one trihaloalkyl group such as trichloromethyl and tribromomethyl. Preferred examples include compounds having the trihaloalkyl group bonded to a nitrogen-containing heterocyclic group such as s-triazine derivative and oxadiazole derivative.

The following are especially preferred examples of the trihaloalkyl-substituted nitrogen-containing heterocyclic compounds or trihaloalkylsulfonyl compounds.

T-1

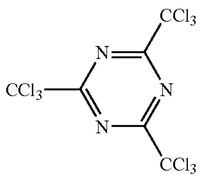

T-2

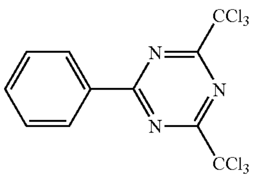

T-3

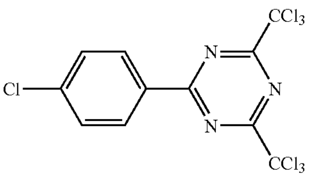

T-4

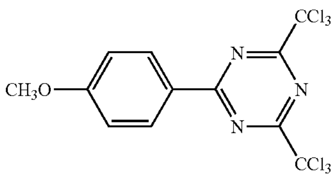

-continued

T-5

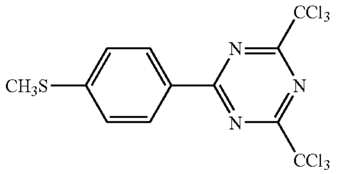

T-6

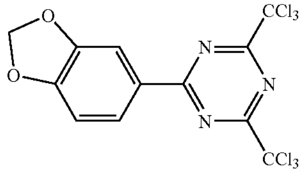

T-7

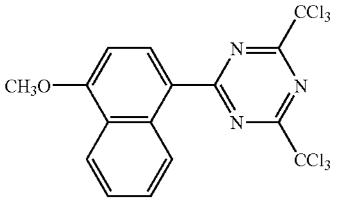

T-8

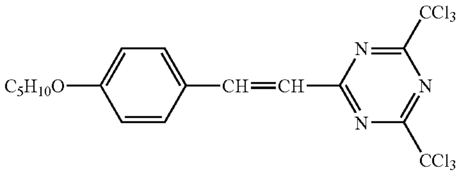

T-9

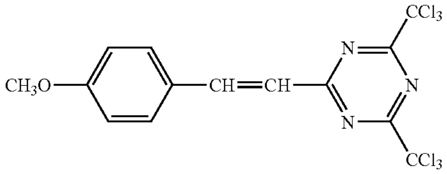

T-10

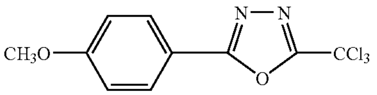

T-11

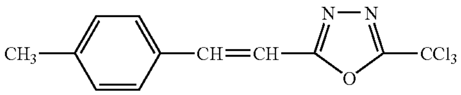

T-12

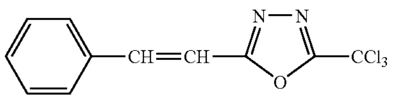

T-13

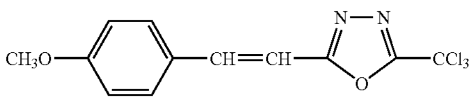

T-14

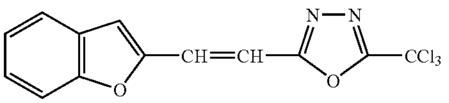

-continued

BR-1

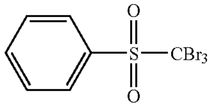

BR-2

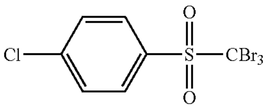

BR-3

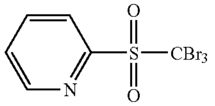

BR-4

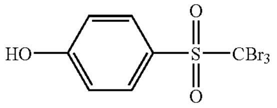

BR-5

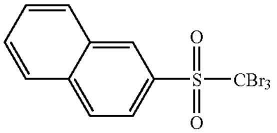

BR-6

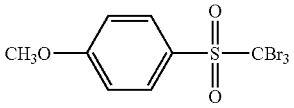

BR-7

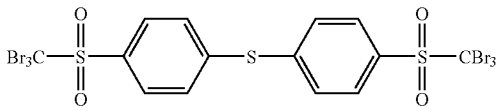

BR-8

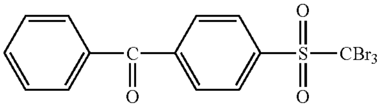

BR-9

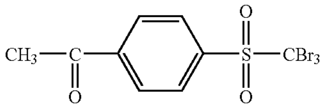

BR-10

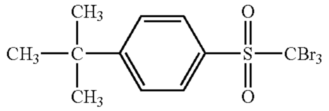

A content of the radical polymerization initiator as described above falls within a range of preferably from 1 to 40 mass %, and more preferably from 1 to 20 mass %, relative to the alkali soluble resin.

As the polymerizable compound having an ethylenic double bond to be used in the photosensitive composition of the invention, known compounds can be used. By containing the polymerizable compound, the resulting composition is presumed to have improved film strength, high sensitivity, excellent adhesion with a support, and improved print durability.

As the polymerizable compound having an ethylenic double bond, various compounds, such as monomers having a molecular weight not greater than 1,000, oligomers having a molecular weight of 1,000 or greater, and compounds having a molecular weight similar to that of polymers can be used. Examples of such compounds include esters between an unsaturated carboxylic acid (such as acrylic acid, methacrylic acid, itaconic acid, crotonic acid, isocrotonic acid, or maleic acid) and an aliphatic polyhydric alcohol compound, amides between an unsaturated carboxylic acid and an aliphatic polyvalent amine compound, urethanes between an unsaturated alcohol and an isocyanate compound, and esters between an unsaturated carboxylic acid and an epoxy compound.

Specific examples include ethylene glycol diacrylate, ethylene glycol dimethacrylate, diethylene glycol diacrylate, diethylene glycol dimethacrylate, triethylene glycol diacrylate, triethylene glycol dimethacrylate, polyethylene glycol diacrylate, polyethylene glycol dimethacrylate, butylene glycol dimethacrylate, hexanediol diacrylate, hexanediol dimethacrylate, neopentyldiol diacrylate, neopentyldiol dimethacrylate, polypropylene glycol diacrylate, methoxydiethylene glycol methacrylate, methoxytetraethylene glycol methacrylate, methoxypolyethylene glycol methacrylate, trimethylolpropane trimethacrylate, pentaerythritol diacrylate, pentaerythritol dimethacrylate, pentaerythritol triacrylate, pentaerythritol trimethacrylate, pentaerythritol tetraacrylate, and pentaerythritol hexaacrylate.

The polymerizable compound having an ethylenic double bond can be synthesized in a known manner or is commercially available. Examples of it include those manufactured by Toagosei, NOF, Kyoeisha Chemical, Shin-Nakamura Chemical, Mitsubishi Chemical, Nippon Kayaku, and Osaka Organic Chemical Industry.

The polymerizable compound having an ethylenic double bond is added in an amount of preferably from 1 to 80 mass %, more preferably from 2 to 70 mass %, based on the total mass of the photosensitive composition (based on the total solid content of the photosensitive composition). The amount of 1 mass % or greater improves the sensitivity, whereas the amount not greater than 80 mass % improves the scratch resistance of an image portion (exposed portion). Amounts within the above-described range are therefore preferred.

The photosensitive composition of the invention may contain, in addition to the above-described components, a colorant, a leuco dye, a lipid sensitive resin, a polymerization inhibitor, a surfactant, a plasticizer, and the like, if necessary, insofar as such an additive does not impair the advantage of the invention.

The photosensitive composition of the invention may contain a colorant in order to facilitate visualization of images. Preferred examples of the colorant include oil soluble dyes and basic dyes. Specific examples include Crystal Violet, Malachite Green, Victoria Blue, Methylene Blue, Ethyl Violet, Rhodamine B, “Victoria Pure Blue BOH” (trade name; product of Hodogaya Chemical), “Oil Blue 613” (trade name; product of Orient Chemical Industries) and Oil Green. The amount of the colorant is preferably from 0.05 to 5.0 mass %, more preferably from 0.1 to 4.0 mass %, each based on the photosensitive composition. The amount of 0.05 mass % or greater, particularly 0.1 mass % or greater facilitates visualization of an image because of sufficient coloring of a photosensitive layer. The amount not greater than 5.0 mass %, particularly 4.0 mass %, on the other hand, can prevent remaining of the dye on the non-image portion after development. Amounts within the above-described range are therefore preferred.

The photosensitive composition of the invention may contain a leuco dye for the purpose of coloring the photosensitive layer and control of dissolution in a developer. As leuco dyes, lactone-ring-containing dyes to be used conventionally for heat sensitive recording materials are preferred. Specific examples of preferred leuco dyes include 3,3-bis(p-dimethylaminophenyl)phthalide, 3,3-bis(p-dimethylaminophenyl)-6-dimethylaminophthalide (also known as Crystal Violet Lactone), 3,3-bis(p-dimethylaminophenyl)-6-dimethylaminophthalide, 3,3-bis(p-dimethylaminophenyl)-6-chlorophthalide, 3,3-bis(p-dibutylaminophenyl)phthalide, 3,3-bis(p-diethylamino-2-ethoxyphenyl)-4-azaphthalide, 3,6-dimethoxyfluoran, 3-cyclohexylamino-6-chlorofluoran, 3-(N,N-diethylamino)-5-methyl-7-(N,N-dibenzylamino) fluoran, 3-dimethylamino-5,7-dimethylfluoran, 3-dimethylamino-7-methylfluoran, 3-diethylamino-7,8-benzfluoran, 3-diethylamino-6-methyl-7-chlorofluoran, 3-diethylamino-7-chloroaminofluoran, 3-pyrrolidino-6-methyl-7-anilinofluoran, 3-dimethylamino-6-methyl-7-anilinofluoran, 3-butylamino-6-methyl-7-anilinofluoran, 2-(N-(3'-trifluoromethylphenyl)amino)-6-diethylaminofluoran, and 2-(3,6-bis(diethylamino)-9-(o-chloroanilino)xanthylbenzoic acid lactam.

The leuco dye is added in an amount of from 0.01 to 10 mass %, preferably from 0.05 to 5 mass % based on the photosensitive composition. The amount of 0.01 mass % or greater, especially 0.05 mass % or greater enables sufficient coloration of a photosensitive layer, leading to excellent visual characteristics. An amount not greater than 10 mass %, especially not greater than 5 mass % particularly improves the development property of a non-image portion (exposed portion). Amounts within the above-described range are therefore preferred.

The photosensitive composition of the invention may further contain a lipid sensitive resin in order to improve the lipid sensitivity (lipophilicity) of the photosensitive layer. As the lipid sensitive resin, for example, a condensate of a phenol substituted with a $C_{3-15}$ alkyl group and an aldehyde or a t-butylphenol formaldehyde resin as described in Japanese Application Publication No. 50-125806 can be used.

A ratio of the lipid sensitive resin in the total mass of the photosensitive composition is preferably from 0.01 to 10 mass %, more preferably from 0.05 to 10 mass %.

It is desired to incorporate a small amount of a compound having a polymerizable ethylenically unsaturated double bond, that is, a thermal polymerization inhibitor for inhibiting unnecessary thermal polymerization of the polymerizable compound. Examples of the suitable thermal polymerization inhibitor include hydroquinone, p-methoxyphenol, di-t-butyl-p-cresol, pyrogallol, t-butylcatechol, benzoquinone, 4,4-thiobis(3-methyl-6-t-butylphenol), 2,2-methylenebis(4-methyl-6-t-butylphenol), and N-nitrosophenylhydroxyamine cerium (I) salt. The thermal polymerization inhibitor is added in an amount of preferably from about 0.01 to about 5 mass % relative to the mass of nonvolatile components in the photosensitive composition. A higher fatty acid derivative such as behenic acid or behenic acid amide may be added, if necessary, to prevent polymerization inhibition by oxygen, thereby distribute it only on the surface of the layer during drying after application. The higher fatty acid derivative is added in an amount of preferably from about 0.5 to about 10 mass % relative to the nonvolatile components in the photosensitive composition.

The photosensitive composition may contain a nonionic surfactant as described in Japanese Application Publication No. 62-251740, Japanese Application Publication No. 03-208514, or Japanese Application Publication No. 2006-241033 or an amphoteric surfactant as described in Japanese Application Publication No. 59-121044 or Japanese Application Publication No. 04-13149 in order to ensure stable processing for different development conditions. Preferred examples of the nonionic surfactant include sorbitan tristearate, sorbitan monopalmitate, sorbitan trioleate, monoglyceride stearate, polyoxyethylene nonyl phenyl ether, and fluorine surfactants. Preferred examples of the amphoteric surfactant include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine (for example, "Amogen K", trade name; product of Dai-ichi Kogyo). The content of the nonionic surfactant or amphoteric surfactant in the photosensitive composition is preferably from 0.01 to 15 mass %, more preferably from 0.01 to 10 mass %. When the amount is 0.01 mass % or greater, the development property is particularly good. The amount of 15 mass % or greater weakens the intensity of the image portion.

The photosensitive composition of the invention may contain a plasticizer to give flexibility to a film to be formed using it. Examples thereof include butyl phthalyl, polyethylene glycol, tributyl citrate, diethyl phthalate, dibutyl phthalate, dihexyl phthalate, dioctyl phthalate, tricresyl phosphate, trioctyl phosphate, and tributyl phosphate.

A content of the plasticizer in the photosensitive composition is preferably from 0.01 to 10 mass %, more preferably from 0.05 to 10 mass %.

A negative lithographic printing original plate obtained by disposing, on a support, a photosensitive layer containing the above-described photosensitive composition is also one aspect of the present invention. The lithographic printing original plate of the invention can be produced generally by dissolving the above-described components of the photosensitive composition in a solvent to prepare a photosensitive solution and applying the resulting photosensitive solution onto an appropriate support. Examples of the solvent include, but are not limited to, methanol, ethanol, propanol, methylene chloride, ethyl acetate, tetrahydrofuran, propylene glycol monomethyl ether, propylene glycol monoethyl ether, methyl cellosolve, ethyl cellosolve, methylcellosolve acetate, ethylcellosolve acetate, dimethylformamide, dimethylsulfoxide, dioxane, dioxolane, acetone, cyclohexanone, trichloroethylene, methyl ethyl ketone, and γ-butyrolactone. These solvents may be used either alone or in combination thereof. The concentration of the above-described components (total solid content including additives) in the photosensitive solution is preferably from 1 to 50 mass %.

Various methods can be used for applying the photosensitive solution. Examples include spin coating, extrusion coating, bar coater coating, roll coating, air knife coating, dip coating and curtain coating. The application amount of the photosensitive solution varies, depending on the intended use, but is preferably from 0.5 to 5.0 $g/m^2$ in dry weight.

Examples of the support include metal plates made of, for example, aluminum, zinc, copper, or steel, metal plates, paper, plastic films or glass plates plated or deposited with chromium, zinc, copper, nickel, aluminum, or iron, resin coated paper, and hydrophilized plastic films.

As the support, a polyester film or an aluminum plate is preferred, among which an aluminum plate is especially preferred because it has good size stability and is available at a relatively low cost. The aluminum plate preferably used in the invention is a pure aluminum plate or an alloy plate composed mainly of aluminum and containing a trace amount of a foreign element. It may be a plastic film laminated or deposited with aluminum. Thus, the composition of the aluminum plate usable in the invention is not limited and aluminum plates made of conventionally known materials can be used as needed. The thickness of the aluminum plate used in the invention is from about 0.1 to 0.5 mm, preferably from 0.12 mm to 0.4 mm.

Degreasing may be performed using, for example, a surfactant or an aqueous alkaline solution in order to remove rolling oil from the surface prior to surface roughening of the aluminum plate. Various methods are employed for surface roughening of the aluminum plate, and examples thereof include a mechanical method, an electrochemical method, and a chemical method of selectively dissolving the surface. Any known method such as brush polishing, ball polishing, blast polishing, and buff polishing can be used as the mechanical method. The electrochemical surface roughening method is, for example, a method using an alternating current or a direct current in an electrolytic solution of hydrochloric acid or nitric acid. A method disclosed in Japanese Application Publication No. 53-123204 in which a mechanical method and an electrochemical method are used in combination can also be used. The aluminum plate having a surface thus roughened is, after alkali etching and neutralization treatment, if necessary, subjected to anodization to increase water retentivity and wear resistance of the surface as desired. As electrolytes used for anodization of the aluminum plate, sulfuric acid, phosphoric acid, oxalic acid, or chromic acid, or mixtures thereof are usually employed.

The conditions for anodization vary depending on the kind of the electrolyte used therefor so that they cannot be specified absolutely, but adequate anodization can be carried out under the following conditions: a concentration of the electrolyte solution of from 1 to 60 wt %, a liquid temperature of from 5 to 60° C., an electric current density of from 2 to 50 $A/dm^2$, a voltage of from 1 to 100 V, and an electrolysis time of from 5 seconds to 3 minutes. A suitable amount of an anodic oxide coating is from 0.5 to 5.0 $g/m^2$. The amount of 0.5 $g/m^2$ or greater may particularly improve wear resistance, whereas the amount not greater than 5.0 $g/m^2$ may inhibit penetration of dyes or the like into the pores formed by anodization. Amounts within the above-described range are therefore preferred.

After anodization, the aluminum plate may further be subjected to after-treatment such as chemical conversion treatment with an alkali silicate, sodium phosphate, sodium fluoride, zirconium fluoride, an alkyl titanate, or trihydroxybenzoic acid or a mixture thereof; pore sealing treatment by dipping the plate in a hot aqueous solution or with a steam bath; coating treatment with an aqueous solution of strontium acetate, zinc acetate, magnesium acetate, or calcium benzoate; or chemical conversion or coating treatment of the surface or back surface of the aluminum plate with polyvinyl pyrrolidone, polyaminesulfonic acid, polyvinylphosphonic acid, polyacrylic acid, or polymethacrylic acid.

Furthermore, an aluminum support subjected to surface treatment as described in Japanese Publication No. 10-297130 can also be used as the support.

The lithographic printing original plate of the invention has preferably, on a support thereof, a photosensitive layer containing the above-described photosensitive composition and a protective layer thereon. The photosensitive layer of the lithographic printing original plate of the invention is a photopolymerizable or thermally polymerizable negative type photosensitive layer. Since exposure is usually performed in the atmosphere, a water soluble protective layer is laid over an image recording layer in order to prevent mixing of low molecular compounds such as oxygen and basic substances which are present in the atmosphere and disturb an exposure-induced image formation reaction in the image recording layer. The water soluble protective layer in the invention is therefore required to have low permeability of low molecular compounds such as oxygen, not to substantially hinder the transmission of light to be used for exposure, to have excellent adhesion to the image recording layer, and to be easily removable in a development step after exposure. Such devices conventionally made for a protective layer are described specifically in U.S. Pat. No. 3,458,311 and Japanese Application Publication No. 55-49729. As materials usable for the protective layer, for example, water soluble compounds having relatively excellent crystallinity can be used. Specifically, water soluble polymers such as polyvinyl alcohol, polyvinylpyrrolidone, acidic celluloses, gelatin, gum arabic, and polyacrylic acid are known. Use of the water soluble polymers composed mainly of polyvinyl alcohol yields the most satisfactory results in view of fundamental characteristics such as oxygen blocking property and easy removability during development.

The polyvinyl alcohol to be used for the protective layer may be substituted partially with an ester, ether, or acetal, as long as it contains an unsubstituted vinyl alcohol unit for imparting the protective layer with necessary oxygen-blocking property and water solubility. Similarly, a part of the polyvinyl alcohol may have another copolymerization component. Specific examples of the polyvinyl alcohol include those having a hydrolysis degree of from 71 to 100% and a molecular weight of from 200 to 3,000. Specific examples include "PVA-105", "PVA-110", "PVA-117", "PVA-117H", "PVA-120", "PVA-124", "PVA-124H", "PVA-CS", "PVA-CST", "PVA-HC", "PVA-203", "PVA-204", "PVA-205", "PVA-210", "PVA-217", "PVA-220", "PVA-224", "PVA-217EE", "PVA-217E", "PVA-220E", "PVA-224E", "PVA-405", "PVA-420", "PVA-613", or "L-8" (each, trade name; product of Kuraray); "JT-05", "JP-05", and "JF-17" (each, trade name; product of Japan VAM & POVAL); and "GOHSENOL NL-05", "GOHSENOL NM-11", "GOHSENOL NM-14", "GOHSENOL AL-06", "GOHSENOL P-610", and "GOHSENOL C-500" (each, trade name; product of Nippon Synthetic Chemical Industry).

Components (kind of PVA and whether an additive is used or not) and coating amount of the protective layer are determined while taking into consideration oxygen blocking property and removability during development and also fogging property, adhesion and scratch resistance. In general, the higher the degree of hydrolysis of PVA to be used (the higher the content of the unsubstituted vinyl alcohol unit in the protective layer) or the thicker the protective layer is, the higher the oxygen blocking property, which is advantageous from the standpoint of sensitivity. When the oxygen blocking property is extremely increased, however, an unnecessary polymerization reaction may occur during production or during storage of an unprocessed stock, or unnecessary fogging or thickening of image lines occurs during exposure. Also, adhesion to an image portion and scratch resistance are extremely important in handling a plate. Described specifically, when a hydrophilic layer made of a water soluble polymer is stacked over a lipophilic photosensitive layer, film separation is likely to occur due to insufficient adhesive strength, and the separated portion causes defects such as poor film hardening due to polymerization hindrance by oxygen. Various proposals have been made to improve adhesion between these two layers. For example, U.S. patent application Ser. No. 292,501 and U.S. patent application Ser. No. 44,563 describe that sufficient adhesion can be achieved by mixing from 20 to 60 weight % of an acrylic emulsion or a water insoluble vinylpyrrolidone-vinyl acetate copolymer in a hydrophilic polymer composed mainly of polyvinyl alcohol and stacking the mixture over the photosensitive layer. Such a known technique can be used for the photosensitive layer composition of the invention. The coating method of such a protective layer is described in detail in, for example, U.S. Pat. No. 3,458,311 and Japanese Patent Publication No. 49729/1980. Use of polyvinyl alcohol and polyvinyl pyrrolidone in combination for the photosensitive composition of the invention is preferred from the viewpoints of adhesion, sensitivity, and prevention of fogging. Polyvinyl alcohol and polyvinyl pyrrolidone are added preferably at a ratio (mass ratio) of 3:1 or less, meaning that a PVP/PVA mixing ratio is not greater than 1/3. The dry weight of the water soluble protective layer is preferably from 1.0 to 3.0 g/$m^2$.

In the lithographic printing original plate of the invention, the photosensitive layer and the protective layer are not necessarily adjacent to each other as long as the photosensitive layer has the protective layer thereover. An intermediate layer may be disposed between the photosensitive layer and the protective layer to adhere them.

In the lithographic printing original plates of the invention, the surface of the protective layer of the original plate is sometimes matted in order to improve the separation between the original plates when many original plates are stacked one after another without a separation sheet therebetween or in order to improve the separation between the separation sheet and the original plate even if a separation paper is inserted between the stacked original plates. The surface of the protective layer is matted by adding a matting agent into the protective layer or by spraying a solution or dispersion in which a water soluble resin or a water soluble resin and a matting agent are dissolved or dispersed to the surface of the protective layer. Examples of the matting agent include silicon dioxide, zinc oxide, titanium oxide, alumina powder, starch, corn starch, and polymer particles (such as particles of polyacrylic acid or polystyrene).

Another function can also be imparted to the protective layer. For example, safelight aptitude can be enhanced without causing a reduction in sensitivity by adding a colorant (such as water soluble dye) that is superior in transmittance of light having a wavelength used for exposure and capable of efficiently absorbing light of a wavelength not contributing to image formation.

As a laser light source to which the lithographic printing original plate of the invention is exposed, light sources with an emission wavelength in a near infrared to infrared region such as a solid laser and a semiconductor laser are preferred. The emission wavelength is preferably from 760 to 1,300 nm. Examples of the light source for UV exposure include carbon arc lamp, mercury lamp, metal halide lamp, xenon lamp, and chemical lamp. The emission wavelength is preferably from 300 to 500 nm.

As a developer or developer replenisher to be used for the development of the lithographic printing original plate of the invention, an aqueous alkali developer is suitable. Examples of the alkali agent include inorganic alkali agents such as sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium borate, potassium borate, ammonium borate, and sodium carbonate; and organic alkali agents such as monomethylamine, dimethylamine, trimethylamine, monoethylamine, diethylamine, triethylamine, monoethanolamine, diethanolamine, triethanolamine, sodium octanoate, and tetramethylammonium hydroxide. These alkali agents may be used either alone or in combination.

The above-described aqueous alkali solutions may also contain an activator. As the activator, an anionic surfactant or amphoteric surfactant may be used.

As the ionic surfactant, sulfate esters of a $C_{8-22}$ alcohol (for example, sodium polyoxyethylene alkyl sulfate), alkylarylsulfonate salts (for example, sodium dodecylbenzenesulfonate, sodium polyoxyethylene dodecylphenyl sulfate, sodium alkylnaphthalenesulfonate, sodium naphthalenesulfonate, and sodium naphthalenesulfonate-formalin condensate), sodium dialkylsulfosuccinates, alkyl ether phosphate esters, and alkyl phosphate esters. As the amphoteric surfactant, alkylbetaines and alkylimidazolines are preferred. The aqueous alkali solution may further contain a water soluble sulfite such as sodium sulfite, potassium sulfite, lithium sulfite or magnesium sulfite.

EXAMPLES

The present invention will hereinafter be described more specifically by way of Examples. It should, however, be borne in mind that the present invention is not limited thereto.

After alkali degreasing of a 0.24 mm-thick aluminum plate (Material: 1050), the surface of the plate was polished using a nylon brush while pouring an aqueous suspension of pumice stone thereon, followed by rinsing in a water well. The surface of the plate was then etched in an amount of 3 g/$m^2$ by pouring a 15 wt % aqueous solution of sodium hydroxide on the plate at 70° C. for 5 seconds. After rinsing in water, the plate was subjected to electrolytic surface roughening treatment in a 1N hydrochloric acid bath at 200 coulomb/$dm^2$. After further rinsing in water, the surface was etched again with a 15% aqueous solution of sodium hydroxide by weight, and after rinsing in water, the plate was immersed in a 20% aqueous solution of nitric acid for dismounting by weight. Next, anodization was performed in a 15 wt. aqueous solution of sulfuric acid and a 2.0 g/$m^2$ oxidation coating was formed on the surface. After rinsing in water, post-treatment was performed with a mixed solution of 50° C. composed of 1 wt. % potassium fluoride and 10 wt. % monosodium phosphate. The resulting plate was rinsed in water and then dried.

Examples 1 to 3

Three photosensitive solutions (i) to (iii) were prepared by changing the silane coupling agent (II) of the invention contained therein. The resulting photosensitive solutions were applied onto the aluminum plates to yield a dry film thickness of 1.5 g/$m^2$, followed by drying at 90° C. for 3 minutes to obtain lithographic printing plates.

Example 1

Photosensitive Solution (i)

Specified silane coupling agent (S-1) (1.0 g)

Polymerizable compound (E-1) (0.6 g)

Specified alkali soluble resin (A-1) (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: "Oil Blue 613" (trade name, product of Orient Chemical Industry) (0.05 g)

Solvent: Propylene glycol monomethyl ether/tetrahydrofuran=20 ml/20 ml

Example 2

Photosensitive Solution (ii)

Specified silane coupling agent (S-2) (1.0 g)

Polymerizable compound (E-1) (0.6 g)

Specified alkali soluble resin (A-2) (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: “Oil Blue 613” (trade name, product of Orient Chemical Industry) (0.05 g)

Solvent: Propylene glycol monomethyl ether/tetrahydrofuran=20 ml/20 ml

Example 3

Photosensitive Solution (iii)

Specified silane coupling agent (S-1) (0.5 g)

Specified silane coupling agent (S-2) (0.5 g)

Polymerizable compound (E-1) (0.6 g)

Specified alkali soluble resin (A-1) (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: “Oil Blue 613” (trade name product of Orient Chemical Industry) (0.05 g)

Solvent: Propylene glycol monomethyl ether/tetrahydrofuran=20 ml/20 ml

Similarly, Comparative photosensitive solutions 1, 2, and 3 were prepared using the following Comparative photosensitive solution 1 (using a silane coupling agent different from that of the invention), Comparative photosensitive solution 2 (containing a specific silane coupling agent in a trace amount outside the defined range), and Comparative photosensitive solution 3 (using an alkali soluble resin different from that of the invention). The photosensitive solutions thus obtained were applied onto the aluminum plate to yield a dry film thickness of 1.5 g/m$^2$, followed by drying at 90° C. for 3 minutes to obtain lithographic printing plates, respectively.

Comparative Example 1

Comparative Photosensitive Solution 1

Comparative silane coupling agent (1.0 g)

Polymerizable compound (E-1) (0.6 g)

Specified alkali soluble resin (A-1) (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: “Oil Blue 613” (trade name, product of Orient Chemical Industry) (0.05 g)

Solvent: Propylene glycol monomethyl ether/tetrahydrofuran=20 ml/20 ml

Comparative silane coupling agent is represented by the following formula:

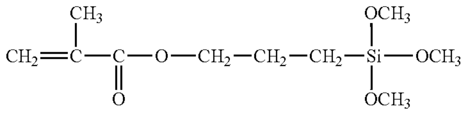

Comparative Silane Coupling Agent

Comparative Example 2

Comparative Photosensitive Solution 2

Specified silane coupling agent (S-1) (0.02 g)

Polymerizable compound (E-1) (0.6 g)

Specified alkali soluble resin (A-1) (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: “Oil Blue 613” (trade name, product of Orient Chemical Industry) (0.05 g)

Solvent: Propylene glycol monomethyl ether/tetrahydrofuran 20 ml/20 ml

Comparative Example 3

Comparative Photosensitive Solution 3

Specified silane coupling agent (S-1) (1.0 g)

Polymerizable compound (E-1) (0.6 g)

Comparative alkali soluble resin (2.0 g)

Infrared absorber: Infrared absorber (1) (0.05 g)

Radical polymerization initiator 1: Organic boron salt (B-6) (0.1 g)

Radical polymerization initiator 2: Triazine compound (T-7) (0.1 g)

Dye: “Oil Blue 613” (trade name; product of Orient Chemical Industry) (0.05 g)

Solvent: Propylene glycol monomethyl ether/tetrahydrofuran=20 ml/20 ml

Comparative alkali soluble resin is represented by the following formula:

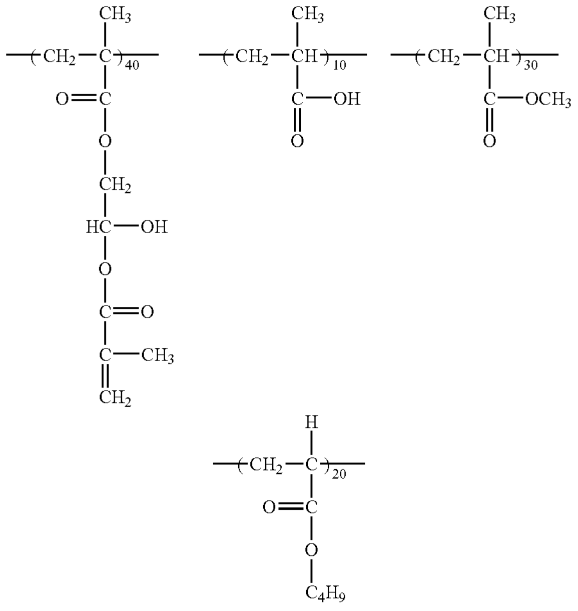

Comparative alkali soluble resin

A-1

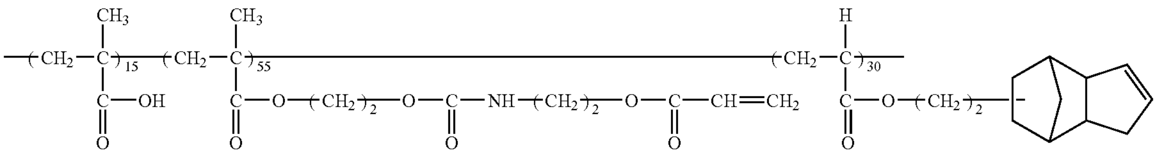

E-1

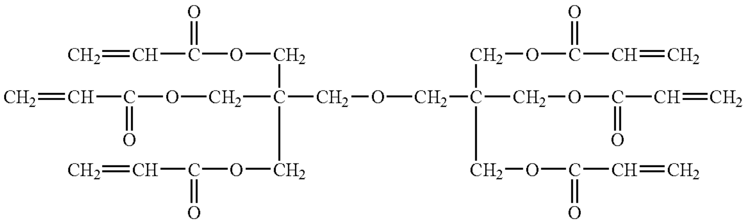

B-6

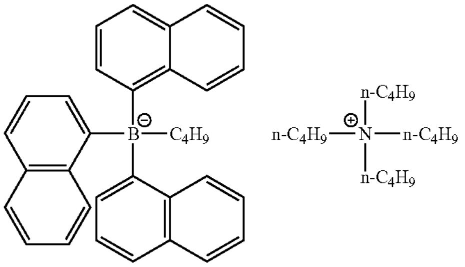

T-7

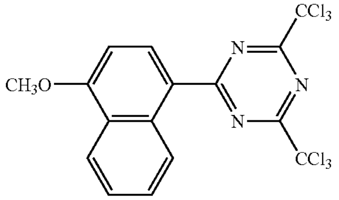

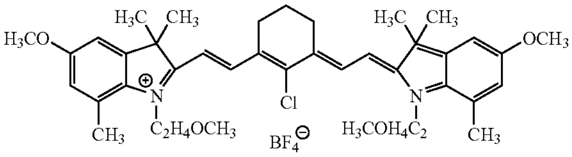

S-1

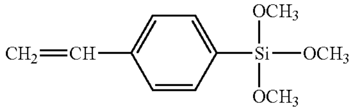

S-2

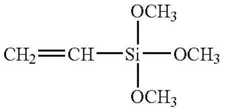

Infrared absorber (1)

Water Soluble Protective Layer

A coating solution of a water soluble protective layer as described below was applied to the surface of the photosensitive layer by a wire bar, followed by drying with a dryer at 90° C. for 3 minutes. The coating amount was 2.0 g/m$^2$.

Coating Solution of Water Soluble Protective Layer

| | |
|---|---|
| Polyvinyl alcohol (product of Nippon Synthetic Chemical Industry, saponification degree: 89 mol %, polymerization degree: 500) | 100 g |
| Surfactant ("Emalex 710", trade name; product of Nihon Emulsion) | 0.03 g |
| Distilled water | 50 g |

Evaluation Method

The lithographic printing original plates thus obtained were evaluated in the following manner.

1. Evaluation of Sensitivity

The lithographic printing original plates thus obtained were each exposed using "Trendsetter 800Q™" (trade name; product of Creo) at a resolution of 2,400 dpi and a rotational speed of its external drum of 360 rpm while changing exposure energy. After exposure, the resulting plate was developed at 30° C. for 12 seconds with a developer ("DH-N", trade name; product of Fuji Photo Film) diluted (×4) while using an automatic developing machine "PK-910II". The exposure energy at which a flat tint set at 50% in FM mode was confirmed to show 50.5 (±0.5) % reproducibility by using iCplate II" (trade name of a dot densitometer; product of Gretagmacbeth) was designated as exposure sensitivity.

2. FM Screening Test (Image Reproducibility)

Each plate was exposed using "Trendsetter 800 Q™" (trade name; product of Creo) at exposure energy of 50 mj/cm$^2$ while using FM Staccato 36. After exposure, a developer ("DH-N", trade name; product of FUJIFILM) was diluted (×4) and development was performed therewith at 30° C. for 12 seconds by using an automatic developing machine "PK-910 II". It was confirmed by "iCplate II" (trade name of a dot densitometer; product of Gretagmacbeth) that a flat tint set at 50% in FM mode showed 50.5 (±0.5) % reproducibility.

3. Print Durability Test

Halftone dot images having a density of from 1% to 100% in 1% increments, which had been obtained similarly at an exposure energy of 50 mj/cm$^2$, were printed on high-quality paper with commercially available offset ink by using a printing machine manufactured by Ryobi. Whenever printing of 1,000 sheets of paper was completed, the machine was stopped and the image portion was magnified in an electron micrograph. The print durability was evaluated by counting the number of the sheets until one of the 20-μm square dots of the halftone image dropped out.

4. Chemical Resistance

After Ultra Plate Cleaner Mild (product of SK Liquid) was added dropwise for 30 minutes to the 50% halftone image obtained as described above at an exposure energy of 50 mj/$cm^2$ and was wiped off with an absorbent cotton, the site to which the cleaner was added dropwise was fixed completely with Cellotape (trade mark, product of Nichiban). The chemical resistance was evaluated by how the image site was damaged by the vigorous removal of the tape.

TABLE 1

| | Sensitivity (mj/$cm^2$) | FM screening 50% flat tin reproducibility | Print durability (thousand pieces) | Chemical resistance |
|---|---|---|---|---|
| Example 1 | 50 | 50.3% | 100 | A |
| Example 2 | 50 | 50.1% | 80 | A |
| Example 3 | 50 | 50.7% | 100 | A |
| Comparative Example 1 | 70 | 43% | 30 | C |
| Comparative Example 2 | 50 | 52% | 30 | B |
| Comparative Example 3 | 120 | 52% | 20 | C |

*evaluation criterion (chemical resistance)
A: no damage
B: decrease of glossy
C: lack of image As is apparent from Table 1, a thermal negative type lithographic printing original plate equipped with a photosensitive layer having the photosensitive composition of the invention containing a specified silane coupling agent and a specified alkali soluble resin has high sensitivity, is excellent in image reproducibility in FM screening, and is excellent in print durability and chemical resistance of a minute image portion.

What is claimed is:

1. A photosensitive composition comprising:

an alkali soluble resin having a monomer unit represented by the following formula (I):

(I)

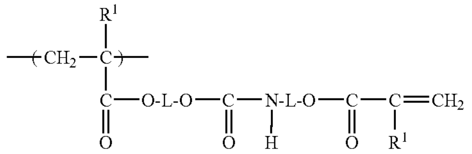

wherein, in the formula (I), $R^1$ represents a hydrogen atom or a $C_{1-10}$ alkyl group which may have a substituent, and L represents an alkylene group which may have a substituent or an arylene group which may have a substituent;

a silane coupling agent represented by the following formula (II):

(II)

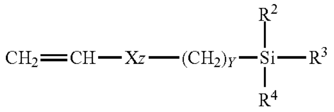

wherein, $R^2$ to $R^4$ each represents a hydrogen atom, an alkyl group which may have a substituent, or an alkoxy group, X represents an ester bond, an amide bond, or a phenylene group, Z stands for 0 or 1, and Y stands for an integer from 1 to 10;

an infrared absorber;

a radical polymerization initiator; and a polymerizable compound having an ethylenic double bond, wherein the silane coupling agent is contained in an amount ranging from 15% to 40% of the photosensitive composition by mass, wherein the alkali soluble resin has further a monomer unit represented by the following formula (III) and/or (IV):

(III)

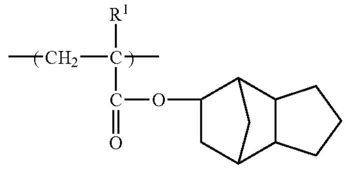

(IV)

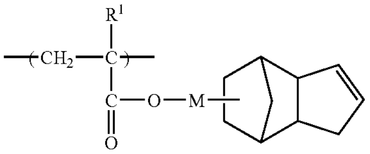

wherein, in the formulas (III) and (IV), $R^1$ represents a hydrogen atom or a $C_{1-10}$ alkyl group which may have a substituent, and M represents a $C_{1-10}$ alkylene group which may have a substituent.

2. A negative type lithographic printing original plate comprising:

a support; and a photosensitive layer of the photosensitive composition according to claim 1, the photosensitive composition layer being formed on the support.

3. A negative type lithographic printing original plate comprising:

a support;

a photosensitive layer of the photosensitive composition according to claim 1, the photosensitive layer being formed on the support; and a protective layer which is formed as an upper layer of the photosensitive layer.

* * * * *